(12) United States Patent (10) Patent No.: US 10,075,144 B2
Standish (45) Date of Patent: Sep. 11, 2018

(54) SYSTEMS AND METHODS FOR ENHANCED HIGH FREQUENCY POWER BIAS TEE DESIGNS

(71) Applicant: CommScope Connectivity UK Limited, London (GB)

(72) Inventor: Ian Miles Standish, North Wales (GB)

(73) Assignee: CommScope Connectivity UK Limited, London (GB)

(*) Notice: Subject to any disclaimer, the term of this patent is extended or adjusted under 35 U.S.C. 154(b) by 295 days.

(21) Appl. No.: 14/996,504

(22) Filed: Jan. 15, 2016

(65) Prior Publication Data

US 2016/0211825 A1 Jul. 21, 2016

Related U.S. Application Data

(60) Provisional application No. 62/103,648, filed on Jan. 15, 2015.

(51) Int. Cl.
| | |
|---|---|
| *H01F 5/00* | (2006.01) |
| *H01F 17/06* | (2006.01) |
| *H03H 1/00* | (2006.01) |
| *H04B 3/44* | (2006.01) |
| *H04L 12/10* | (2006.01) |
| *H03H 7/48* | (2006.01) |
| *H02J 1/00* | (2006.01) |

(Continued)

(52) U.S. Cl.
CPC ............ *H03H 7/48* (2013.01); *H01F 17/062* (2013.01); *H02J 1/00* (2013.01); *H04B 3/44* (2013.01);

(Continued)

(58) Field of Classification Search
CPC .... H01F 2005/006; H01F 17/04; H01F 17/06; H01F 1/344; H01F 17/062; H01P 1/2007; H03H 2001/005; H04B 3/44; H04L 12/10
See application file for complete search history.

(56) References Cited

U.S. PATENT DOCUMENTS 6,212,259 B1 4/2001 Kiko
7,446,633 B2 * 11/2008 Yagisawa .............. H01P 1/2007
333/185

(Continued)

FOREIGN PATENT DOCUMENTS

| EP | 2601746 | 6/2013 |
|---|---|---|
| EP | 2601746 A1 | 6/2013 |
| JP | 2004193886 A * | 7/2004 |

OTHER PUBLICATIONS

Dudley, Sandra EM, et al. "Ultra low power optical feeder for VDSL." Optical Fiber Communication Conference, 2005. Technical Digest. OFC/NFOEC. vol. 6. IEEE, 2005, pp. 1-3.*

(Continued)

*Primary Examiner* — Ryan Johnson
(74) *Attorney, Agent, or Firm* — Fogg & Powers LLC

(57) ABSTRACT

Systems and methods for enhanced high frequency power bias tee designs are provided. In one embodiment, a bias tee network comprises: a first port configured to couple across a data line comprising a first electrically conducting line and a second electrically conducting line; a second port configured to couple to a power port of an electrical device; and a distributed impedance interface coupled between the power supply unit and the differential data line, wherein the distributed impedance interface includes a ferrite impedance gradation network having a plurality of ferrite impedance elements series coupled in an order of progressing impedance, wherein a low impedance end of the first ferrite impedance gradation network is coupled to the first port.

30 Claims, 6 Drawing Sheets

(51) Int. Cl.
*H04M 11/06* (2006.01)
*H01P 1/20* (2006.01)

(52) U.S. Cl.
CPC ........... *H04L 12/10* (2013.01); *H04M 11/062* (2013.01); *H01F 2005/006* (2013.01); *H01P 1/2007* (2013.01); *H03H 2001/005* (2013.01); *H03H 2001/0035* (2013.01)

(56) References Cited

U.S. PATENT DOCUMENTS

2002/0080002 A1* 6/2002 Oldfield ................ H01F 27/255
336/231

2007/0063771 A1* 3/2007 Pan ....................... H01P 1/2007
330/149

OTHER PUBLICATIONS

International Search Authority, "International Search Report and Written Opinion for PCT Application No. PCT/EP2016/050828", "from Foreign Counterpart to U.S. Appl. No. 14/996,504", filed Mar. 24, 2016, pp. 1-13, Published in: WO.

Coilcraft, "Insertion Loss 4310LC Wideband Bias Choke", Jun. 8, 2012, p. 1 Publisher: 2012, Coilcraft, Inc.

European Patent Office, "Extended European Search Report from EP Application No. 16700764.0 dated May 18, 2018", "from Foreign Counterpart of U.S. Appl. No. 14/996,504", dated May 18, 2018, pp. 1-6, Published in: EP.

* cited by examiner

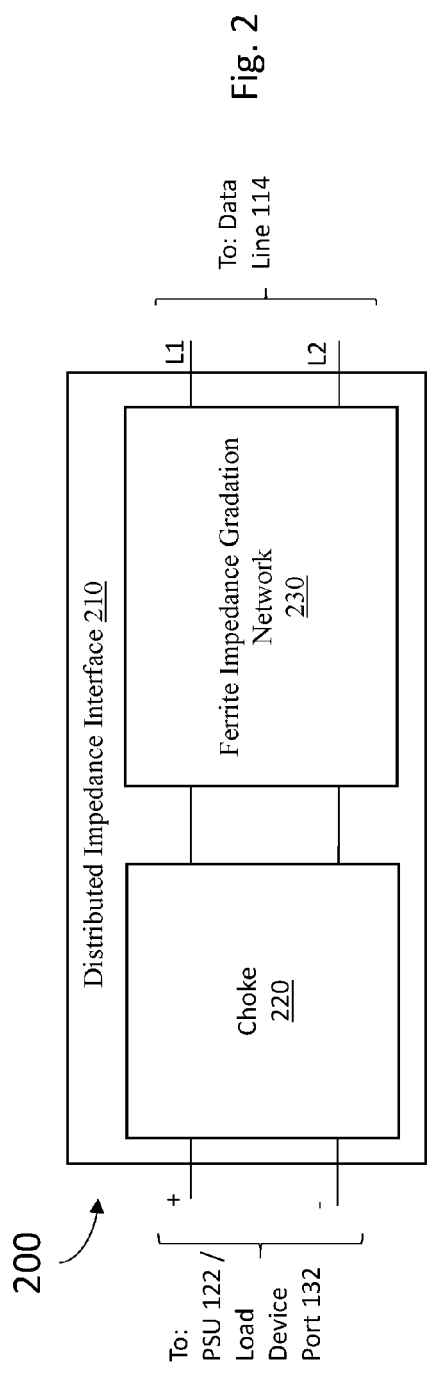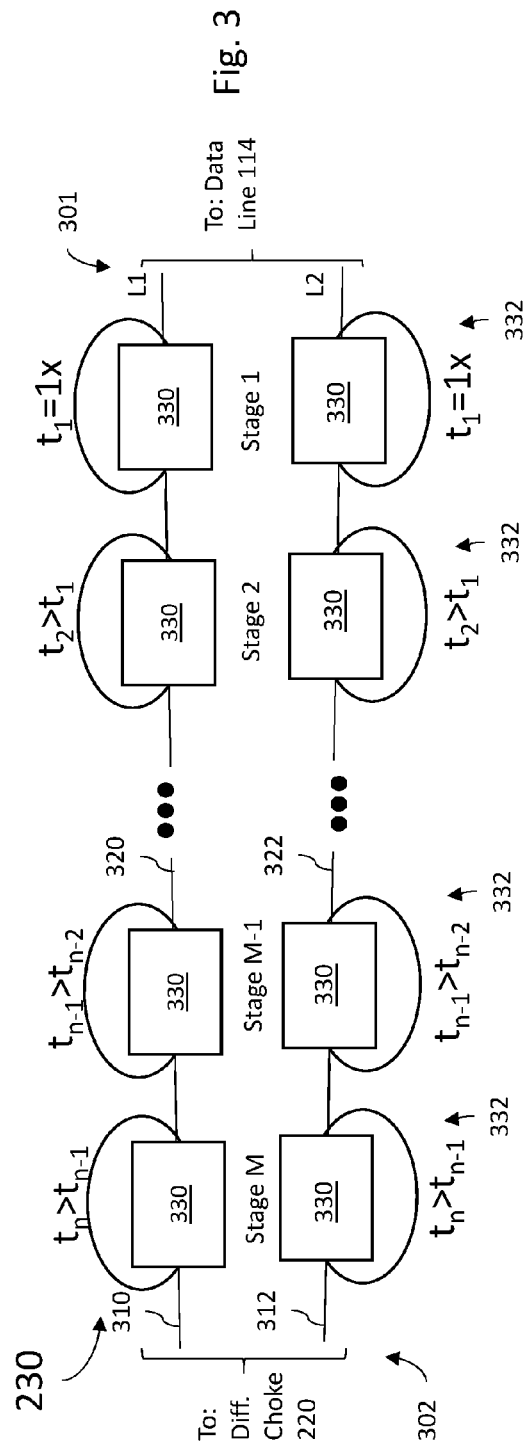

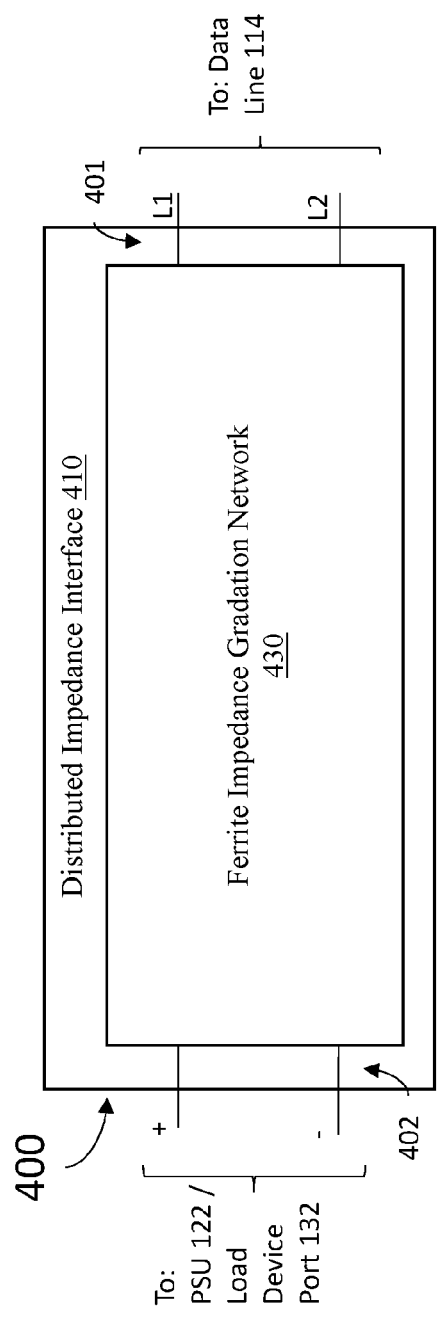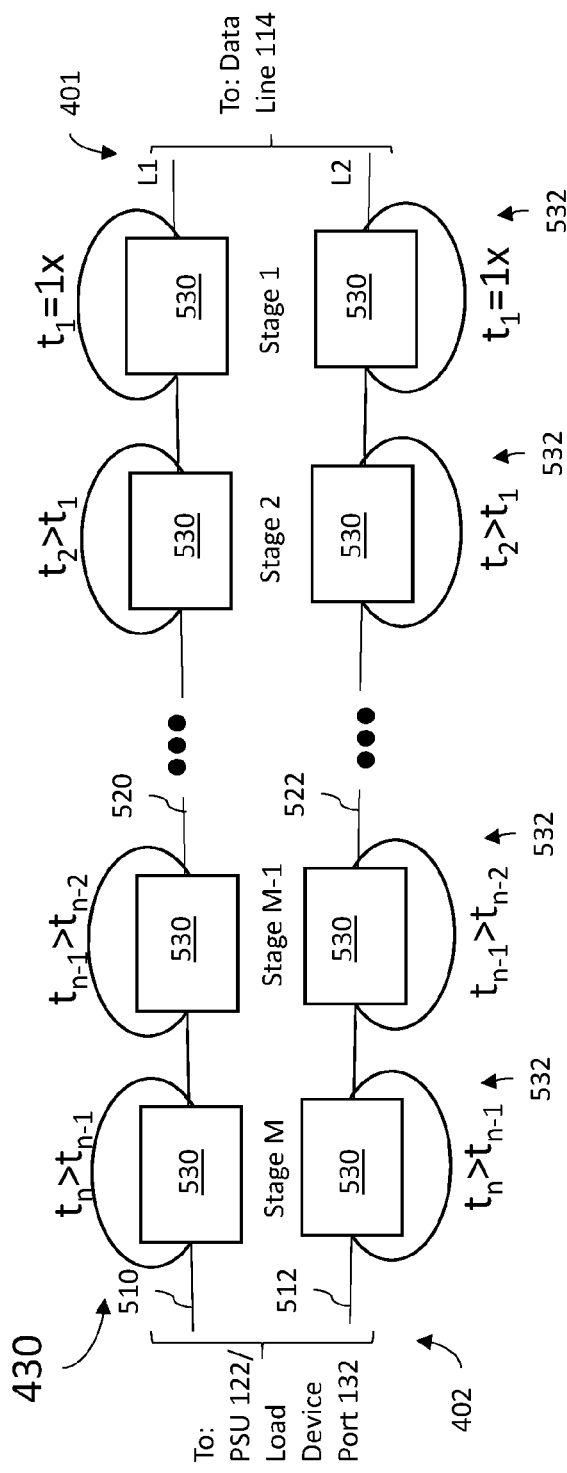

SYSTEMS AND METHODS FOR ENHANCED HIGH FREQUENCY POWER BIAS TEE DESIGNS

CROSS-REFERENCE TO RELATED APPLICATIONS

This application claims priority to, and the benefit of, U.S. Provisional Application No. 62/103,648, entitled "SYSTEMS AND METHODS FOR ENHANCED HIGH FREQUENCY POWER BIAS TEE DESIGNS" which was filed on Jan. 15, 2015 and which is hereby incorporated by reference in its entirety.

BACKGROUND

In system designs used for Digital Subscriber Line (DSL) broadband networks, there is push to move much of the deployment electronics from the network Central Office to locations near the building being served. Fiber optic cables are brought from the Central Office up to a pit or vault where the fiber optic cable meets the copper wire interface to the twisted pair copper wire network for the building. Coupling of the fiber optic cable to the copper wire interface is achieved through a deployment (Dp) unit, often referred to as a Fiber to the Home Deployment (FTTDp) unit. As opposed to bringing power to the deployment unit from the Central Office, reverse powered FTTDp units are now often utilized. This avoids may of the problems associated with powering deployment units from the Central Office, such as the expense of installing the necessary equipment and cables, as well as voltage drop and other power management issues. Instead, power to the deployment unit is supplied directly from the building being serviced by the deployment unit. However, the only electrical conductors typically available in the pit with the deployment unit are the twisted pair wires. This means that reverse powered FTTDp units need to be supplied DC power over the same conductors that carry high bandwidth AC signal QAM modulated DSL signals. Power and DSL signals must co-exist on the same cable.

Typically this has been accomplished by installing two bias-T networks on the twisted pair lines: one within the building being served and one at the deployment unit. The first bias-T network within the building is coupled to a power supply unit that is powered from a building supplied electrical circuit. This first bias-T network may be referred to as a power injector because it adds DC power onto the twisted pair lines going to the deployment unit. At the deployment unit, the second bias-T network, often referred to as a power splitter, takes the DC power off the twisted pair lines to power the deployment unit. The power injector and power splitter need to be designed so that the DC power on the copper wires ideally does not load or otherwise affect the differential driven xDSL service. Legacy DSL system operated at a relatively low frequency range, starting at 32 KHz. However, modern DSL signals such as VDSL 30 may operate at frequencies up to 30 MHz, and upcoming protocols such as VDSL/G. Fast will operate at higher data bandwidths (for example, up to 106 MHz or up to 212 MHz or greater), where signal integrity is of paramount importance. Consequently, any imbalances or notches in the frequency band caused by parasitic loads from the power injector or power splitter will have increasingly detrimental effects on the overall bandwidth which the copper wire can support.

For the reasons stated above and for other reasons stated below which will become apparent to those skilled in the art upon reading and understanding the specification, there is a need in the art for alternate systems and methods for Enhanced High Frequency Power Bias Tee Designs.

SUMMARY

The Embodiments of the present disclosure provide methods and systems for providing enhanced high frequency power bias tee designs and will be understood by reading and studying the following specification.

Systems and methods for enhanced high frequency power bias tee designs are provided. In one embodiment, a bias tee network comprises: a first port configured to couple across a data line comprising a first electrically conducting line and a second electrically conducting line; a second port configured to couple to a power port of an electrical device; and a distributed impedance interface coupled between the power supply unit and the differential data line, wherein the distributed impedance interface includes a ferrite impedance gradation network having a plurality of ferrite impedance elements series coupled in an order of progressing impedance, wherein a low impedance end of the first ferrite impedance gradation network is coupled to the first port.

DRAWINGS

Embodiments of the present disclosure can be more easily understood and further advantages and uses thereof more readily apparent, when considered in view of the description of the preferred embodiments and the following figures in which:

FIG. 2 is a diagram illustrating a distributed impedance interface of one embodiment of the present disclosure;

FIG. 3 is a diagram illustrating a ferrite impedance gradation network of one embodiment of the present disclosure;

FIG. 4 is a diagram illustrating another distributed impedance interface of one embodiment of the present disclosure;

FIG. 5 is a diagram illustrating another ferrite impedance gradation network of one embodiment of the present disclosure;

In accordance with common practice, the various described features are not drawn to scale but are drawn to emphasize features relevant to the present disclosure. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present disclosure. The following detailed description is, therefore, not to be taken in a limiting sense.

Embodiments of the present disclosure provide system and methods for enhanced high frequency power bias tee network for use as power injectors and power splitters for reverse powered deployment units for differential driven Digital Subscriber Line (DSL) services. It should be understood that the terms "DSL" and "xDSL" as used herein are intended to generically encompass varying implementations of DSL based broadband technologies rather than any one specific implementation. For example, embodiments of the present disclosure may be implemented using DSL technologies such as, but not limited to, Asymmetric Digital Subscriber Line (ADSL), Symmetrical Digital Subscriber Line (SDSL), High data rate Digital Subscriber Line (HDSL), Very High data rate Digital Subscriber Line (VDSL), or Rate-Adaptive Digital Subscriber Line (RADSL).

The enhanced frequency power bias tee designs disclosed herein isolate the xDSL service signal from the effects of DC power electronics. High impedance networks render the power injector and power splitter nearly invisible across a very wide frequency range, while providing nearly no impedance to the DC power being injected onto the copper wire. More specifically, the enhanced frequency power bias tee designs described herein disclose embodiments of a distributed impedance interface that introduces a ferrite impedance gradation network. In alternate embodiments presented below, a ferrite impedance gradation network may be used alone, or in conjunction, for example, with a commercially available differential or common mode choke. In other embodiments, a wide band isolation choke device (which may be implemented as either a differential or common mode choke) featuring a ferrite impedance gradation network is also disclosed.

Figure 1:
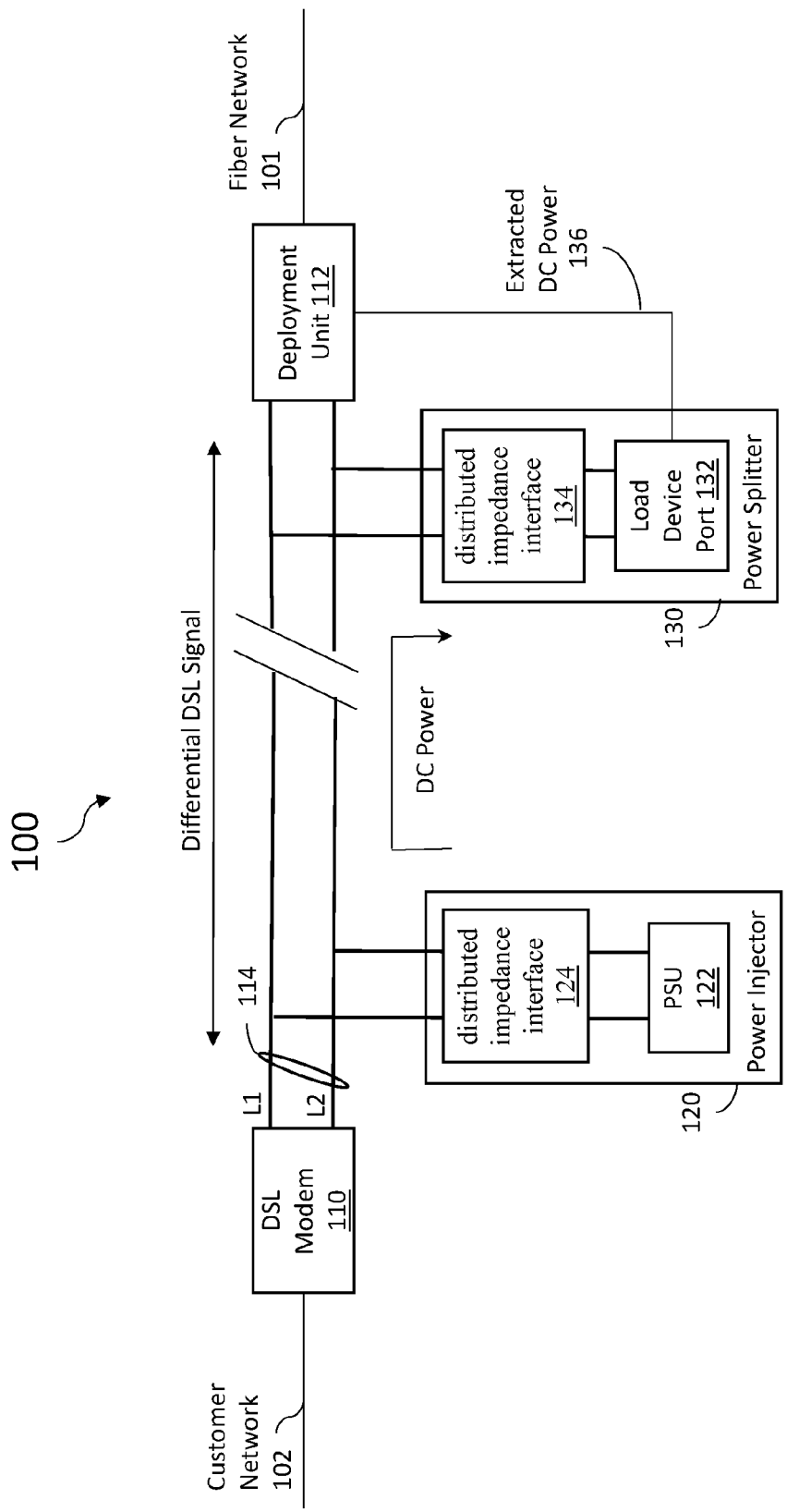
FIG. 1 is a diagram illustrating a reversed power deployment system of one embodiment of the present disclosure.

FIG. 1 is a diagram illustrating a reversed power deployment system 100 of one embodiment of the present disclosure. System 100 comprises a DSL modem 110 coupled to a DSL deployment unit 112 via a differential data line 114. Data line 114 comprises a first electrically conducting line (L1) and a second electrically conducting line (L2) and may be implemented using twisted pair copper wires. DSL modem 110 is an electronic device that provides a data interface for communicating data between the differential data line 114 and the customer network 102 (which may be an Ethernet network, for example). DSL deployment unit 112 is an electronic device that provides a data interface for communicating data between the differential data line 114 and fiber network 101. Data packets between DSL modem 110 and deployment unit 112 are transported over L1 and L2 using differential DSL signals modulated over a spectrum of bandwidth referred to herein as the DSL data band.

As mentioned above, system 100 operates as a reversed power deployment system meaning that the electronics of DSL deployment unit 112 are powered from an electrical source from within the customer facilities. DC power to DSL deployment unit 112 is carried over the electrically conducting lines L1 and L2 of differential data line 114, the same lines that transport the differential DSL signals. More specifically, DC power used to power DSL deployment unit 112 is injected onto differential data line 114 by a power injector 120 (within the customer facilities) and then tapped off of differential data line 114 by a power splitter 130 (within the pit or vault housing DSL deployment unit 112).

Both the power injector 120 and power splitter 130 tap onto the conducting lines L1 and L2 of differential data line 114 using a bias-T configuration.

As shown in FIG. 1, with one or more embodiments of the present disclosure, power injector 120 includes a power supply unit (PSU) 122 that is coupled across the differential data line 114 via a distributed impedance interface 124 (which is described in greater detail below). Power splitter 120 includes a load device port 132 coupled to the differential data line 114 via a distributed impedance interface 134. Load device port 132 provides DC power 136 extracted from differential data line 114 to the deployment unit 112. Although shown in FIG. 1 as separated devices, in alternate embodiments, power injector 120 may be integrated into DSL modem 110 while power splitter 130 may be integrated into deployment unit 112.

To signals transported in the frequency spectrum of the DSL data band, the connection of PSU 122 and/or load device port 132 onto L1 and L2 would appear as the equivalent of dead shorts place on each end of data line 114. A dead short across the two lines of such a differential data link would essentially null the any signal on that path. As such, the function of the distributed impedance interfaces 124 and 134 is to establish a high impedance interface at the data line 114 looking into power injector 120 and power splitter 130 across the frequency range of the DSL data band, while at the same time providing a low impedance path for DC power to flow from PSU 122 through to load device port 132. With embodiments of the present disclosure, this may be accomplished using a distributed impedance interface that comprises a ferrite impedance gradation network which mitigates imbalances and/or notches in the frequency band that would otherwise be caused by parasitic loading from coupling the power injector 120 and power splitter 130 onto data line 114.

FIG. 2 is a diagram illustrating at 200 a distributed impedance interface 210 of one embodiment of the present disclosure. In various embodiments, distributed impedance interface 210 may be used to implement the distributed impedance interface 124 of power injector 120 and/or the distributed impedance interface 134 of power splitter 130. In the embodiment shown in FIG. 2, distributed impedance interface 210 comprises a choke element 220 coupled to a ferrite impedance gradation network 230. In one embodiment choke element 220 comprises a commercially available differential wound choke device which may comprise a pair of multiple turn windings of copper wire differentially wound around a common ferrite core. In other embodiments choke element 220 comprises a commercially available common mode wound choke device which may comprise a pair of multiple turn windings of copper wire common mode wound around a common ferrite core.

As shown in FIG. 2, choke element 220 is coupled across (+) and (−) power terminals of PSU 122, when implemented for power injector 120. When implemented for power splitter 130, choke element 220 is coupled across (+) and (−) power terminals of load device port 132.

By itself, choke element 220 will introduce an impedance that functions to isolate DSL data line 114 from apparent short circuits, but in doing so introduces parasitic components into system 100 which can have detrimental effects on high frequency data communications if coupled to data line 114. Accordingly, the ferrite impedance gradation network 230 coupled to the choke element 220 introduces a network of mutual capacitance and parasitic elements that function to mask, or further isolate, data line 114 from the parasitics introduced by choke element 220. Ferrite impedance gradation network 230 provides a means to cause the connection between choke element 220 to the data line 114 to have high impedance across as wide of a band as possible, so that from the point of view of the differential DSL signal, coupling of the power injector 120 or power splitter 130 has no observable effect.

FIG. 3 is a diagram that illustrates one embodiment of ferrite impedance gradation network 230 as comprising a plurality of impedance elements (shown at 330) which are series coupled in an order of progressing impedance from a low impedance end 301 of network 230 to a high impedance end 302. In the particular embodiment of FIG. 3, ferrite impedance gradation network 230 comprises a plurality of cascaded ferrite impedance elements 330 arranged in M stages of ferrite element pairs (shown at 332). A first conductor 310 is cascade wound through the core of a first ferrite element 330 of each pair 332 to define a first leg 320 of network 230, while a second conductor 312 is cascade wound through the core of the second ferrite element 330 of each pair to define a second leg 322 of network 230. Starting at the high impedance end 302, each pair of ferrite elements 332 contributes progressively less impedance until reaching the low impedance end 301, which is where distributed impedance interface 210 is coupled to data line 114. That is, at the low impedance end 301, first conductor 310 is coupled to L1 of data line 114 while second conductor 312 is coupled to L2 of data line 114. At the high impedance end 302, first conductor 310 and second conductor 320 are coupled to choke element 220.

Figure 3A:
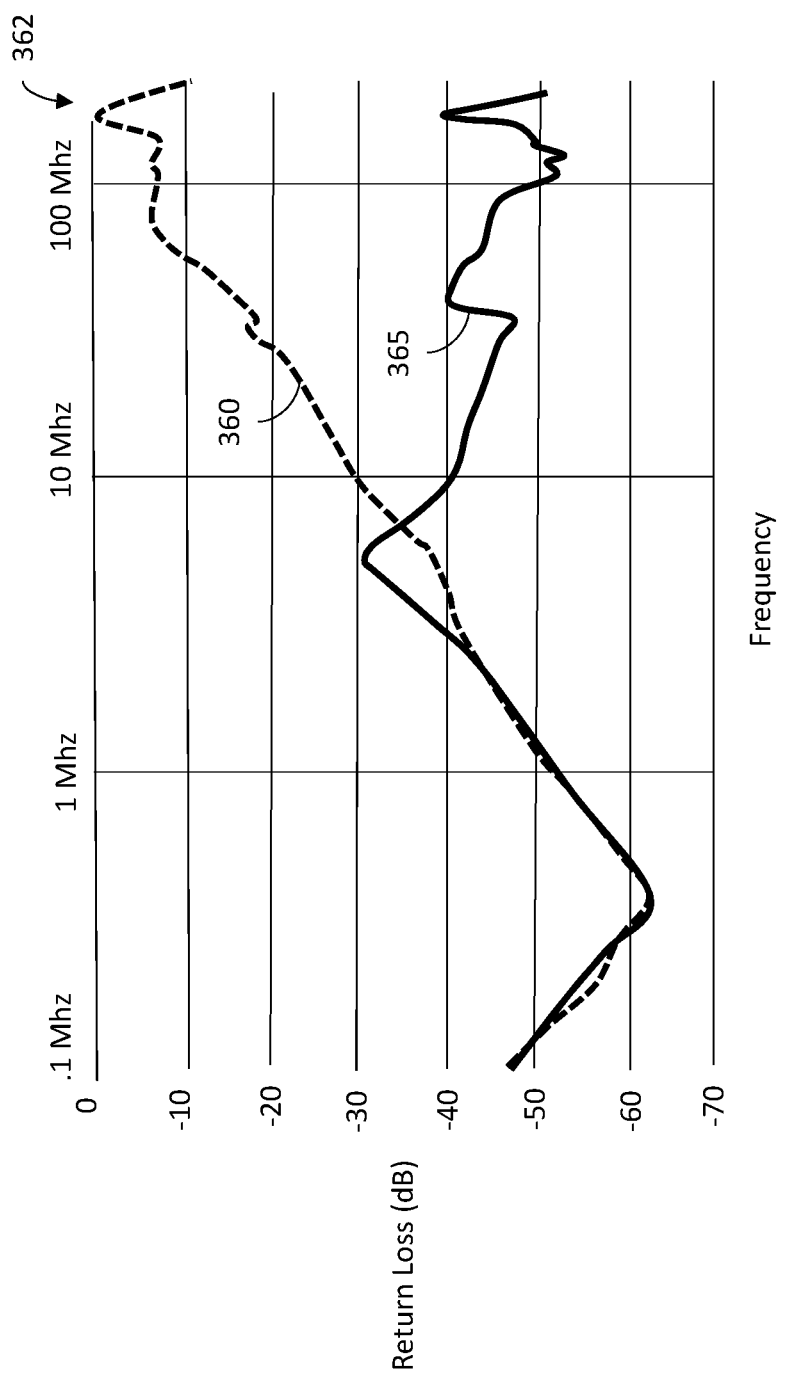
FIG. 3A is a graph illustrating reflective losses.

The impedance contributed by each pair 322 of ferrite elements 330 is dictated by the number of turns that their respective conductors (310, 312) make through the respective element cores. For example, in one embodiment, on each leg 320, 322 the ferrite impedance element 330 at the high impedance end 302 comprises the highest number of turns ($t_n$) through its core, with each next impedance element having progressively fewer turns until the final impedance element 330, comprises the fewest turns (e.g. only a single turn ($t_1=1\times$)) of the conductor through its core. As should be noted, induction at each ferrite impedance element 330 is a function of the square of the number of turns the conductor makes through the core of the element 330. As such, the ferrite element pair 332 at the low impedance end 301 coupled to data line 114 will exhibit almost no distributed capacitance and a low inductance (from a one winding turn), causing minimal impact to data transmitted on the DSL data band of data line 114. Each of the M stages of the ferrite element pairs 332 will serve to mask data line 114 from parasitics introduced by choke element 220. Further, ferrite impedance gradation network 230 may function to extend high impedance isolation of data line 114 to frequencies beyond which choke element 220 provides isolation, as shown in FIG. 3A. In FIG. 3A, dashed trace 360 illustrates example data reflecting return loss verses frequency for a choke element 220. Solid trace 365 illustrates example data reflecting return loss verses frequency for a choke element 220 coupled in series with a ferrite impedance gradation network 230 having M=4 stages of ferrite element pairs cascade wound from t=4 turns (at the high impedance end 302) to t=1 turn (at the low impedance end 301). As shown in trace 360, return loss gradually degrades for choke element 220, reaching a point (shown at 362) of being a dead short at frequencies near about 200 MHz. In contrast as shown in trace 365, with choke element 220 in combination with a ferrite impedance gradation network 230, return loss remains at −30 dB or less across the plotted frequency range.

FIG. 4 illustrates at 400 another alternate embodiment of a distributed impedance interface 410 of one embodiment of the present disclosure. In various embodiments, distributed impedance interface 410 may be used to implement the distributed impedance interface 124 of power injector 120 and/or the distributed impedance interface 134 of power splitter 130. In the embodiment shown in FIG. 4, distributed impedance interface 410 comprises an extended range ferrite impedance gradation network 430 as opposed to the use of a choke element in combination with a ferrite impedance gradation network. In alternate embodiments, the high impedance end 402 of extended range ferrite impedance gradation network 430 may be either coupled across (+) and (−) power terminals of PSU 122 (when implemented for power injector 120) or coupled across (+) and (−) power terminals of load device port 132 (when implemented for power splitter 130).

FIG. 5 is a diagram that illustrates one embodiment of ferrite impedance gradation network 430 as comprising a plurality of impedance elements (shown at 530) which are series coupled in an order of progressing impedance from the low impedance end 401 of network 430 to the high impedance end 402. Ferrite impedance gradation network 430 comprises a plurality of cascaded ferrite impedance elements 530 arranged in M stages of ferrite element pairs 532. Since the ferrite impedance gradation network 430 must now itself provide isolation over the full spectral range from near DC through the DSL data band, ferrite impedance gradation network 430 will accordingly comprise more stages of ferrite element pairs 532 than ferrite impedance gradation network 230.

In the same fashion as described for FIG. 3, a first conductor 510 is cascade wound through the core of a first ferrite element 530 of each pair 532 to define a first leg 520 of network 430, while a second conductor 512 is cascade wound through the core of the second ferrite element 530 of each pair 532 to define a second leg 522 of network 430. Starting at the high impedance end 402, each pair of ferrite elements 532 contributes progressively less impedance until reaching the low impedance end 401, which is where distributed impedance interface 410 is coupled to data line 114. That is, at the low impedance end 401, first conductor 510 is coupled to L1 of data line 114 while second conductor 512 is coupled to L2 of data line 114. At the high impedance end 402, first conductor 410 and second conductor 420 are coupled to either PSU 122 (when implemented for power injector 120) or load device port 132 (when implemented for power splitter 130). The impedance contributed by each pair of ferrite elements is dictated by the number of turns that their respective conductors (510, 512) make through the element cores. On each leg 520, 522, the ferrite impedance element 530 at the high impedance end 402 comprises the highest number of turns ($t_n$) through its core, with each next impedance element having progressively fewer turns until the final impedance element 530, which in this example comprises only a single turn ($t_1=1\times$) of the conductor through its core. Having only a single turn, the ferrite element pair 532 at the low impedance end 401 coupled to data line 114 will exhibit almost no distributed capacitance and a low inductance, causing minimal impact to data transmitted on the DSL data band of data line 114. The result from ferrite impedance gradation network 430 is a distributed parasitic system with low capacitance and inductance at low impedance end 401, and in term of frequency response, low impedance at DC with high impedance from near DC through the DSL data band.

In designing a ferrite impedance gradation network that utilizes multiple stages of ferrite element pairs, two design considerations are the number of stages to include, and the difference in the number of turns between each progressive stage of the network. These considerations are readily discernable by one of ordinary skill in the art who has studies this disclosure. The first parameter (the number "M" of stages to include) may be selected as a function of the total impedance desired and the spectral range over which isolation (i.e., high impedance) is needed. In some implementations of the embodiment described herein, the ferrite impedance gradation network comprises at least three stages of ferrite element pairs. The difference in the number of turns between each progressive stage of the network will often simply be one, but may be varied in order to tailor the frequency response curve of the distributed impedance interface or for other reasons.

Figure 6:
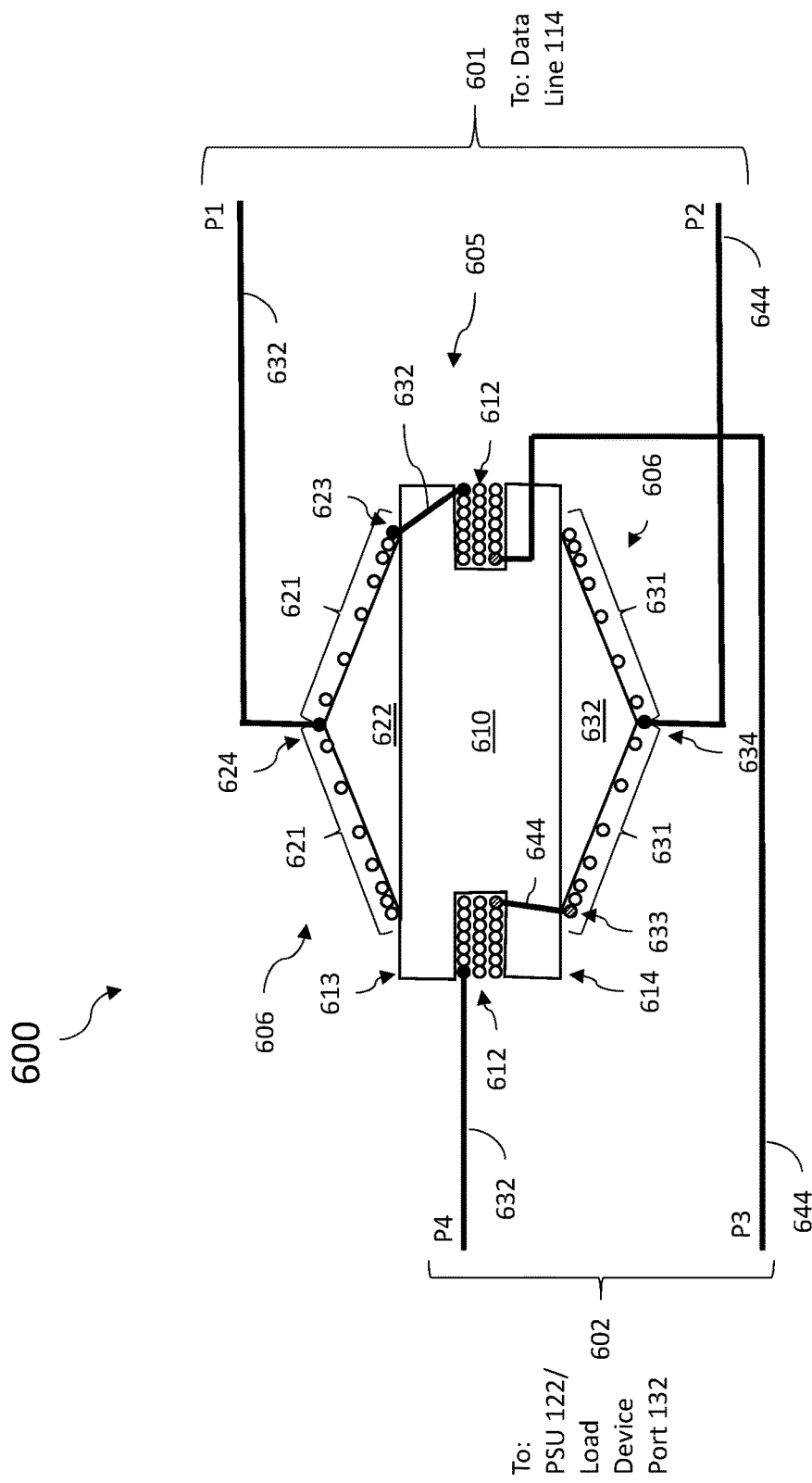
FIG. 6 is a diagram illustrating another distributed impedance interface of one embodiment of the present disclosure.

FIG. 6 is a diagram illustrating another distributed impedance interface device 600 embodiment of the present disclosure which implements the functions of a choke element and a ferrite impedance gradation network in an integrated form factor device. In alternate embodiments, distributed impedance interface device 600 may be used to implement the distributed impedance interface 124 of power injector 120 and/or the distributed impedance interface 134 of power splitter 130, or used in other applications. As shown in FIG. 6, distributed impedance interface device 600 comprises a ferrite ring 610 having a first side 612 and an opposing second side 614, a first conical shaped insulating former 622 extending from the first side 613 and a second conical shaped insulating former 632 extending from the second side 614. Ferrite ring 610 further comprises a continuous slot 612 around a circumference of the ferrite ring 610.

A first conductive wire 632 and a second conductive wire 644 each enter the slot 612 and are wound within slot 612 around ring 610 for a plurality of turns to yield a high inductance choke 605. In one embodiment, first conductive wire 632 and second conductive wire 644 may be differentially wound within slot 612 (i.e., in different directions) such that choke 605 functions as differential choke. In other embodiments, first conductive wire 632 and second conductive wire 644 are common mode wound within slot 612 such that choke 605 functions as a common mode choke. The number of turns around ring 610 is readily determined based on the desired inductance for the choke 605. After completing its first winding with slot 612, the first conductive wire 632 exits slot 612 and is wound a second time in a spiral winding 621 around the first conical shaped insulating former 622, starting at an edge 623 nearest the ferrite ring 610 and progressing away from ring 610 and towards a center 624 of the first conical shaped insulating former 622. Spiral winding 621 is wound such that it comprises a higher winding density near edge 623 that lessens as the winding progresses inward towards center 624. In other words, the turns of spiral winding 621 are spaced closer together near edge 623 and are spaced relatively further apart towards center 624. Similarly, after completing its first winding with slot 612, the second conductive wire 644 exits slot 612 and is wound a second time in a spiral winding 631 around the second conical shaped insulating former 632, starting at an edge 633 nearest the ferrite ring 610 and progressing away from ring 610 and towards a center 634 of the second conical shaped insulating former 632. Spiral winding 631 is also wound such that it comprises a higher winding density near edge 633 that lessens as the winding progresses inward towards center 634. In this embodiment, each turn of the spiral windings 621 and 631 about the formers 622 and 632 define series coupled ferrite impedance elements, for example, equivalent to those described above with respect to FIGS. 3 and 5.

Together, the spiral windings 621 and 631 implement a ferrite impedance gradation network 606. The conductors 632 and 644 forming respective spiral windings 621 and 631 exit on opposite sides of ferrite ring 610, physically separated in space from each other. As shown in FIG. 6, with each subsequent turn around the conical shaped insulating formers 622 and 632, the windings of each conductor increase in distance from each other, decreasing the mutual capacitance between conductors 632 and 644 with each subsequent turn until leads P1 and P2 tap off from their respective centers 624 and 634. Also, those winding turns near edges 623, 633 are still influenced by the inductance of ferrite ring 610. The inductance for each subsequent turn away from edges 623, 633 diminishes as the windings progressively become further away from the ferrite ring 610, and as the distance between the windings themselves increases. The leads P1 and P2 define the low impedance end 601 for ferrite impedance gradation network 606 that may be coupled to the first electrically conducting line (L1) and second electrically conducting line (L2) of data line 114. At the high impedance end 602, lead P4 of first conductive wire 632 and P3 of second conductive wire 644 are coupled to either PSU 122 (when implemented for power injector 120) or load device port 132 (when implemented for power splitter 130). In the same manner as the distributed impedance interfaces described above, distributed impedance interface device 600 permits the connection of power injector 120 and/or power splitter 130 to data line 114 with a high impedance across the DSL data band, so that from the point of view of the differential DSL signal, coupling of the power injector 120 or power splitter 130 has no observable effect on it. At the same time, distributed impedance interface device 600 provides a low impedance path for DC power from PSU 122 for powering deployment unit 112.

Figure 7:
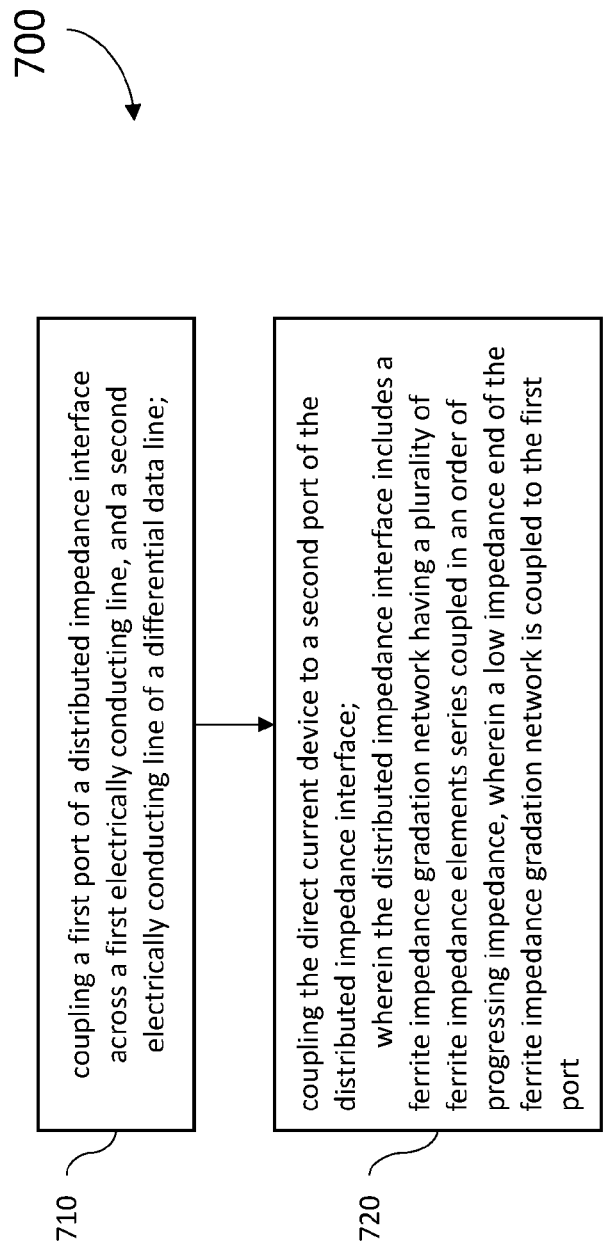
FIG. 7 is a flow chart illustrating a method of one embodiment of the present disclosure.

FIG. 7 is a flow chart illustrating a method 700 of one embodiment of the present disclosure. It should be understood that method 700 may be implemented using any of the other embodiments described herein with respect to FIGS. 1-6. As such, elements of method 700 may be used in conjunction with, in combination with, or substituted for elements of those embodiments described above. Further, the functions, structures and other description of elements for such embodiments described above may apply to like named elements of method 700 and vice versa.

In particular, the flow chart of FIG. 700 describes a method 700 for isolating a direct current device coupled a differential data line from high frequency signals carried on the differential data line. In some implementations, the direct current device may comprise a power supply unit (PSU) such as PSU 122 described above. In other implementations, the direct current device may comprise a load device port such as load device port 132 described above. The differential data line may comprise a DSL line and the high frequency signals comprise a xDSL service signal that needs to be protected from the effects of attaching the direct current device to the line. The method begins at 710 with coupling a first port of a distributed impedance interface across a first electrically conducting line, and a second electrically conducting line of a differential data line and proceeds to 720 with coupling the direct current device to a second port of the distributed impedance interface. The distributed impedance interface isolates the high frequency service signal from the effects of DC power electronics while providing nearly no impedance to DC power being injected onto the data line. The distributed impedance interface includes a ferrite impedance gradation network (such as any one of networks (for example, networks 230, 430 or 606) disclosed above) having a plurality of ferrite impedance elements series coupled in an order of progressing impedance, wherein a low impedance end of the ferrite impedance gradation network is coupled to the first port.

EXAMPLE EMBODIMENTS

Example 1 includes a reversed power deployment system, the system comprising: a differential data line comprising a first electrically conducting line and a second electrically conducting line; a power injector, the power injector coupled across the first electrically conducting line and the second electrically conducting line, the power injector comprising: a power supply unit; and a first distributed impedance interface coupled between the power supply unit and the differential data line, wherein the first distributed impedance interface includes a first ferrite impedance gradation network having a plurality of ferrite impedance elements series coupled in an order of progressing impedance, wherein a low impedance end of the first ferrite impedance gradation network is coupled to the differential data line; a power splitter, the power splitter coupled across the first electrically conducting line and the second electrically conducting line, the power splitter comprising: a load device port; and a second distributed impedance interface coupled between the load device port and the differential data line, wherein the second distributed impedance interface includes a second ferrite impedance gradation network having a plurality of ferrite impedance elements series coupled in an order of progressing impedance, wherein a low impedance end of the second ferrite impedance gradation network is coupled to the differential data line.

Example 2 includes the system of example 1 further comprising: a Digital Subscriber Line (DSL) modem coupled to the first electrically conducting line and the second electrically conducting line at a first end of the differential data line; and a DSL deployment unit coupled to the first electrically conducting line and the second electrically conducting line at a second end of the differential data line, the DSL deployment unit further coupled to the load device port.

Example 3 includes the system of example 2, wherein the power injector is integrated within the DSL modem.

Example 4 includes the system of any of examples 2-3, wherein the power splitter is integrated within the DSL deployment unit.

Example 5 includes the system of any of examples 1-4, wherein the differential data line comprises a twisted pair copper wire link.

Example 6 includes the system of any of examples 1-5, wherein the first plurality of impedance elements each comprise a stage of ferrite element pairs.

Example 7 includes the system of example 6, wherein one or both of the first ferrite impedance gradation network and the second ferrite impedance gradation network comprises: a first leg comprising a first conductor cascade wound through a first ferrite element of each stage of the ferrite element pairs, the first conductor coupled to the first electrically conducting line; and a second leg comprising a second conductor cascade wound through a second ferrite element of each stage of the ferrite element pairs, the second conductor coupled to the second electrically conducting line.

Example 8 includes the system of example 7, wherein the first conductor is wound through each respective first ferrite element of the first leg an increasing number of times starting at a first ferrite element pair electrically closest to the differential data line; and wherein the second conductor is wound through each respective second ferrite element of the second leg an increasing number of times starting at the first ferrite element pair electrically closest to the differential data line.

Example 9 includes the system of any of examples 1-8, wherein the first impedance interface network further comprises a choke network coupled between the first ferrite impedance gradation network and the power supply unit.

Example 10 includes the system of any of examples 1-9, wherein the second impedance interface network further comprises a choke network coupled between the second ferrite impedance gradation network and the load device port.

Example 11 includes the system of any of examples 1-10, wherein the first distributed impedance interface includes a distributed impedance interface device that comprises: a ferrite ring having a first side, an opposing second side and a continuous slot around a circumference of the ferrite ring; a first conical shaped insulating former extending from the first side; a second conical shaped insulating former extending from the second side; a first conductive wire; and a second conductive wire; wherein the first conductive wire and the second conductive wire are differentially wound around the ferrite ring within the continuous slot a plurality of times; wherein the first conductive wire is further wound in a spiral winding pattern around the first conical shaped insulating former starting at an outer edge of the first conical shaped insulating former and proceeding towards a center of the first conical shaped insulating former; and wherein the second conductive wire is further wound in a spiral winding pattern around the second conical shaped insulating former starting at an outer edge of the second conical shaped insulating former and proceeding towards a center of the second conical shaped insulating former.

Example 12 includes the system of example 11, wherein the distributed impedance interface device comprises a low impedance port defined by a first end of the first conductive wire coming off the first conical shaped insulating former and the second conductive wire coming off the second conical shaped insulating former; and wherein the low impedance port is coupled to the differential data line.

Example 13 includes a distributed impedance interface device, the device comprising: a ferrite ring having a first side, an opposing second side and a continuous slot around a circumference of the ferrite ring; a first conical shaped insulating former extending from the first side; a second conical shaped insulating former extending from the second side; a first conductive wire; and a second conductive wire; wherein the first conductive wire and the second conductive wire are differentially wound around the ferrite ring within the continuous slot a plurality of times; wherein the first conductive wire is further wound in a spiral winding pattern around the first conical shaped insulating former starting at an outer edge of the first conical shaped insulating former and proceeding towards a center of the first conical shaped insulating former; and wherein the second conductive wire is further wound in a spiral winding pattern around the second conical shaped insulating former starting at an outer edge of the second conical shaped insulating former and proceeding towards a center of the second conical shaped insulating former.

Example 14 includes a bias tee network, the network comprising: a first port configured to couple across a data line comprising a first electrically conducting line and a second electrically conducting line; a second port configured to couple to a power port of an electrical device; and a distributed impedance interface coupled between the second port and the first port, wherein the distributed impedance interface includes a ferrite impedance gradation network having a plurality of ferrite impedance elements series coupled in an order of progressing impedance, wherein a low impedance end of the first ferrite impedance gradation network is coupled to the first port.

Example 15 includes the network of example 14, wherein the data line comprises a twisted pair copper wire link.

Example 16 includes the network of any of examples 14-15, wherein the data line comprises a differential data line.

Example 17 includes the network of any of examples 14-16, wherein the plurality of impedance elements each comprise a respective ferrite bead.

Example 18 includes the network of any of examples 14-17, wherein the plurality of impedance elements each comprise a stage of ferrite element pairs.

Example 19 includes the network of example 18, wherein the ferrite impedance gradation network comprises: a first leg comprising a first conductor cascade wound through a first ferrite element of each stage of the ferrite element pairs, the first conductor coupled to the first electrically conducting line; and a second leg comprising a second conductor cascade wound through a second ferrite element of each stage of the ferrite element pairs, the second conductor coupled to the second electrically conducting line.

Example 20 includes the network of example 19, wherein the first conductor is wound through each respective first ferrite element of the first leg an increasing number of times starting at a first ferrite element pair electrically closest to the data line; and wherein the second conductor is wound through each respective second ferrite element of the second leg an increasing number of times starting at the first ferrite element pair electrically closest to the data line.

Example 21 includes the network of any of examples 14-20, wherein the distributed impedance interface further comprises a choke network coupled between the ferrite impedance gradation network and the second port.

Example 22 includes the network of any of examples 14-21, wherein the distributed impedance interface device includes a distributed impedance interface device that comprises: a ferrite ring having a first side, an opposing second side and a continuous slot around a circumference of the ferrite ring; a first conical shaped insulating former extending from the first side; a second conical shaped insulating former extending from the second side; a first conductive wire; and a second conductive wire; wherein the first conductive wire and the second conductive wire are differentially wound around the ferrite ring within the continuous slot a plurality of times; wherein the first conductive wire is further wound in a spiral winding pattern around the first conical shaped insulating former starting at an outer edge of the first conical shaped insulating former and proceeding towards a center of the first conical shaped insulating former; and wherein the second conductive wire is further wound in a spiral winding pattern around the second conical shaped insulating former starting at an outer edge of the second conical shaped insulating former and proceeding towards a center of the second conical shaped insulating former.

Example 23 includes the network of any of examples 14-22, wherein the distributed impedance interface device comprises a low impedance port defined by a first end of the first conductive wire coming off the first conical shaped insulating former and the second conductive wire coming off the second conical shaped insulating former; and wherein the low impedance port is configured to couple to the data line.

Example 24 includes a power injector, the power injector comprising: a first port configured to couple to a first electrically conducting line and a second electrically conducting line; a power supply unit; and a distributed impedance interface coupled between the power supply unit and the first port, wherein the impedance interface network includes a ferrite impedance gradation network having a plurality of ferrite impedance elements series coupled in an order of progressing impedance, wherein a low impedance end of the first ferrite impedance gradation network is coupled to the first port.

Example 25 includes the power injector of example 24, wherein the power injector is integrated within a DSL modem comprising a differential data line, the differential data line further comprising the first electrically conducting line and the second electrically conducting line; and wherein the first port is coupled to the differential data line.

Example 26 includes a power splitter, the power splitter comprising: a first port configured to couple to first electrically conducting line and a second electrically conducting line; a load device port; and a distributed impedance interface coupled between the load device port and the first port, wherein the distributed impedance interface includes a ferrite impedance gradation network having a plurality of ferrite impedance elements series coupled in an order of progressing impedance, wherein a low impedance end of the ferrite impedance gradation network is coupled to the first port.

Example 27 includes the power splitter of example 26, wherein the power splitter is integrated within a DSL deployment unit comprising a differential data line, the differential data line further comprising the first electrically conducting line and the second electrically conducting line; and wherein the first port is coupled to the differential data line.

Example 28 includes a method for isolating a direct current device coupled a differential data line from high frequency signals carried on the differential data line, the method comprising: coupling a first port of a distributed impedance interface across a first electrically conducting line, and a second electrically conducting line of a differential data line; and coupling the direct current device to a second port of the distributed impedance interface; wherein the distributed impedance interface includes a ferrite impedance gradation network having a plurality of ferrite impedance elements series coupled in an order of progressing impedance, wherein a low impedance end of the ferrite impedance gradation network is coupled to the first port.

Example 29 includes the method of example 28, wherein the plurality of ferrite impedance elements each comprise a stage of ferrite element pairs.

Example 30 includes the method of example 28, wherein the ferrite impedance gradation network comprises: a first leg comprising a first conductor cascade wound through a first ferrite element of each stage of the ferrite element pairs, the first conductor coupled to the first electrically conducting line; and a second leg comprising a second conductor cascade wound through a second ferrite element of each stage of the ferrite element pairs, the second conductor coupled to the second electrically conducting line.

Example 31 includes the method of example 30, wherein the first conductor is wound through each respective first ferrite element of the first leg an increasing number of times starting at a first ferrite element pair electrically closest to the differential data line; and wherein the second conductor is wound through each respective second ferrite element of the second leg an increasing number of times starting at the first ferrite element pair electrically closest to the differential data line.

Example 32 includes the method of any of examples 28-31, wherein the distributed impedance interface further comprises a choke network coupled between the first ferrite impedance gradation network and the second port.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A reversed power deployment system, the system comprising:
   a differential data line comprising a first electrically conducting line and a second electrically conducting line;
   a power injector, the power injector coupled across the first electrically conducting line and the second electrically conducting line, the power injector comprising:
   a power supply unit; and
   a first distributed impedance interface coupled between the power supply unit and the differential data line, wherein the first distributed impedance interface includes a first ferrite impedance gradation network having a plurality of ferrite impedance elements series coupled in an order of progressing impedance, wherein a low impedance end of the first ferrite impedance gradation network is coupled to the differential data line;
   a power splitter, the power splitter coupled across the first electrically conducting line and the second electrically conducting line, the power splitter comprising:
   a load device port; and
   a second distributed impedance interface coupled between the load device port and the differential data line, wherein the second distributed impedance interface includes a second ferrite impedance gradation network having a plurality of ferrite impedance elements series coupled in an order of progressing impedance, wherein a low impedance end of the second ferrite impedance gradation network is coupled to the differential data line;
   wherein the first distributed impedance interface includes a distributed impedance interface device that comprises:
   a ferrite ring having a first side, an opposing second side and a continuous slot around a circumference of the ferrite ring;
   a first conical shaped insulating former extending from the first side;
   a second conical shaped insulating former extending from the second side;
   a first conductive wire; and
   a second conductive wire;
   wherein the first conductive wire and the second conductive wire are differentially wound around the ferrite ring within the continuous slot a plurality of times;
   wherein the first conductive wire is further wound in a spiral winding pattern around the first conical shaped insulating former starting at an outer edge of the first conical shaped insulating former and proceeding towards a center of the first conical shaped insulating former; and
   wherein the second conductive wire is further wound in a spiral winding pattern around the second conical shaped insulating former starting at an outer edge of the second conical shaped insulating former and proceeding towards a center of the second conical shaped insulating former.

2. The system of claim 1 further comprising:
   a Digital Subscriber Line (DSL) modem coupled to the first electrically conducting line and the second electrically conducting line at a first end of the differential data line; and
   a DSL deployment unit coupled to the first electrically conducting line and the second electrically conducting line at a second end of the differential data line, the DSL deployment unit further coupled to the load device port.

3. The system of claim 2, wherein the power injector is integrated within the DSL modem.

4. The system of claim 2, wherein the power splitter is integrated within the DSL deployment unit.

5. The system of claim 1, wherein the differential data line comprises a twisted pair copper wire link.

6. The system of claim 1, wherein the first plurality of impedance elements each comprise a stage of ferrite element pairs.

7. The system of claim 6, wherein one or both of the first ferrite impedance gradation network and the second ferrite impedance gradation network comprises:
   a first leg comprising a first conductor cascade wound through a first ferrite element of each stage of the ferrite element pairs, the first conductor coupled to the first electrically conducting line; and
   a second leg comprising a second conductor cascade wound through a second ferrite element of each stage of the ferrite element pairs, the second conductor coupled to the second electrically conducting line.

8. The system of claim 7, wherein the first conductor is wound through each respective first ferrite element of the first leg an increasing number of times starting at a first ferrite element pair electrically closest to the differential data line; and
   wherein the second conductor is wound through each respective second ferrite element of the second leg an increasing number of times starting at the first ferrite element pair electrically closest to the differential data line.

9. The system of claim 1, wherein the first impedance interface network further comprises a choke network coupled between the first ferrite impedance gradation network and the power supply unit.

10. The system of claim 1, wherein the second impedance interface network further comprises a choke network coupled between the second ferrite impedance gradation network and the load device port.

11. The system of claim 1, wherein the distributed impedance interface device comprises a low impedance port defined by a first end of the first conductive wire coming off the first conical shaped insulating former and the second conductive wire coming off the second conical shaped insulating former; and
    wherein the low impedance port is coupled to the differential data line.

12. A distributed impedance interface device, the device comprising:
  a ferrite ring having a first side, an opposing second side and a continuous slot around a circumference of the ferrite ring;
  a first conical shaped insulating former extending from the first side;
  a second conical shaped insulating former extending from the second side;
  a first conductive wire; and
  a second conductive wire;
  wherein the first conductive wire and the second conductive wire are differentially wound around the ferrite ring within the continuous slot a plurality of times;
  wherein the first conductive wire is further wound in a spiral winding pattern around the first conical shaped insulating former starting at an outer edge of the first conical shaped insulating former and proceeding towards a center of the first conical shaped insulating former; and
  wherein the second conductive wire is further wound in a spiral winding pattern around the second conical shaped insulating former starting at an outer edge of the second conical shaped insulating former and proceeding towards a center of the second conical shaped insulating former.

13. A bias tee network, the network comprising:
  a first port configured to couple across a data line comprising a first electrically conducting line and a second electrically conducting line;
  a second port configured to couple to a power port of an electrical device; and
  a distributed impedance interface coupled between the second port and the first port, wherein the distributed impedance interface includes a ferrite impedance gradation network having a plurality of ferrite impedance elements series coupled in an order of progressing impedance, wherein a low impedance end of the first ferrite impedance gradation network is coupled to the first port;
  wherein the distributed impedance interface includes a distributed impedance interface device that comprises:
  a ferrite ring having a first side, an opposing second side and a continuous slot around a circumference of the ferrite ring;
  a first conical shaped insulating former extending from the first side;
  a second conical shaped insulating former extending from the second side;
  a first conductive wire; and
  a second conductive wire;
  wherein the first conductive wire and the second conductive wire are differentially wound around the ferrite ring within the continuous slot a plurality of times;
  wherein the first conductive wire is further wound in a spiral winding pattern around the first conical shaped insulating former starting at an outer edge of the first conical shaped insulating former and proceeding towards a center of the first conical shaped insulating former; and
  wherein the second conductive wire is further wound in a spiral winding pattern around the second conical shaped insulating former starting at an outer edge of the second conical shaped insulating former and proceeding towards a center of the second conical shaped insulating former.

14. The network of claim 13, wherein the data line comprises a twisted pair copper wire link.

15. The network of claim 13, wherein the data line comprises a differential data line.

16. The network of claim 13, wherein the plurality of impedance elements each comprise a respective ferrite bead.

17. The network of claim 13, wherein the plurality of impedance elements each comprise a stage of ferrite element pairs.

18. The network of claim 17, wherein the ferrite impedance gradation network comprises:
  a first leg comprising a first conductor cascade wound through a first ferrite element of each stage of the ferrite element pairs, the first conductor coupled to the first electrically conducting line; and
  a second leg comprising a second conductor cascade wound through a second ferrite element of each stage of the ferrite element pairs, the second conductor coupled to the second electrically conducting line.

19. The network of claim 18, wherein the first conductor is wound through each respective first ferrite element of the first leg an increasing number of times starting at a first ferrite element pair electrically closest to the data line; and
  wherein the second conductor is wound through each respective second ferrite element of the second leg an increasing number of times starting at the first ferrite element pair electrically closest to the data line.

20. The network of claim 13, wherein the distributed impedance interface further comprises a choke network coupled between the ferrite impedance gradation network and the second port.

21. The network of claim 13, wherein the distributed impedance interface device comprises a low impedance port defined by a first end of the first conductive wire coming off the first conical shaped insulating former and the second conductive wire coming off the second conical shaped insulating former; and
  wherein the low impedance port is configured to couple to the data line.

22. A power injector, the power injector comprising:
  a first port configured to couple to a first electrically conducting line and a second electrically conducting line;
  a power supply unit; and
  a distributed impedance interface coupled between the power supply unit and the first port, wherein the impedance interface network includes a ferrite impedance gradation network having a plurality of ferrite impedance elements series coupled in an order of progressing impedance, wherein a low impedance end of the first ferrite impedance gradation network is coupled to the first port;
  wherein the distributed impedance interface comprises:
  a ferrite ring having a first side, an opposing second side and a continuous slot around a circumference of the ferrite ring;
  a first conical shaped insulating former extending from the first side;
  a second conical shaped insulating former extending from the second side;
  a first conductive wire; and
  a second conductive wire;
  wherein the first conductive wire and the second conductive wire are differentially wound around the ferrite ring within the continuous slot a plurality of times;

wherein the first conductive wire is further wound in a spiral winding pattern around the first conical shaped insulating former starting at an outer edge of the first conical shaped insulating former and proceeding towards a center of the first conical shaped insulating former; and
wherein the second conductive wire is further wound in a spiral winding pattern around the second conical shaped insulating former starting at an outer edge of the second conical shaped insulating former and proceeding towards a center of the second conical shaped insulating former.

23. The power injector of claim 22, wherein the power injector is integrated within a DSL modem comprising a differential data line, the differential data line further comprising the first electrically conducting line and the second electrically conducting line; and
wherein the first port is coupled to the differential data line.

24. A power splitter, the power splitter comprising:
a first port configured to couple to first electrically conducting line and a second electrically conducting line;
a load device port; and
a distributed impedance interface coupled between the load device port and the first port, wherein the distributed impedance interface includes a ferrite impedance gradation network having a plurality of ferrite impedance elements series coupled in an order of progressing impedance, wherein a low impedance end of the ferrite impedance gradation network is coupled to the first port;
wherein the distributed impedance interface comprises:
a ferrite ring having a first side, an opposing second side and a continuous slot around a circumference of the ferrite ring;
a first conical shaped insulating former extending from the first side;
a second conical shaped insulating former extending from the second side;
a first conductive wire; and
a second conductive wire;
wherein the first conductive wire and the second conductive wire are differentially wound around the ferrite ring within the continuous slot a plurality of times;
wherein the first conductive wire is further wound in a spiral winding pattern around the first conical shaped insulating former starting at an outer edge of the first conical shaped insulating former and proceeding towards a center of the first conical shaped insulating former; and
wherein the second conductive wire is further wound in a spiral winding pattern around the second conical shaped insulating former starting at an outer edge of the second conical shaped insulating former and proceeding towards a center of the second conical shaped insulating former.

25. The power splitter of claim 24, wherein the power splitter is integrated within a DSL deployment unit comprising a differential data line, the differential data line further comprising the first electrically conducting line and the second electrically conducting line; and
wherein the first port is coupled to the differential data line.

26. A method for isolating a direct current device coupled a differential data line from high frequency signals carried on the differential data line, the method comprising:

coupling a first port of a distributed impedance interface across a first electrically conducting line, and a second electrically conducting line of a differential data line; and
coupling the direct current device to a second port of the distributed impedance interface;
wherein the distributed impedance interface includes a ferrite impedance gradation network having a plurality of ferrite impedance elements series coupled in an order of progressing impedance, wherein a low impedance end of the ferrite impedance gradation network is coupled to the first port;
wherein the distributed impedance interface comprises:
a ferrite ring having a first side, an opposing second side and a continuous slot around a circumference of the ferrite ring;
a first conical shaped insulating former extending from the first side;
a second conical shaped insulating former extending from the second side;
a first conductive wire; and
a second conductive wire;
wherein the first conductive wire and the second conductive wire are differentially wound around the ferrite ring within the continuous slot a plurality of times;
wherein the first conductive wire is further wound in a spiral winding pattern around the first conical shaped insulating former starting at an outer edge of the first conical shaped insulating former and proceeding towards a center of the first conical shaped insulating former; and
wherein the second conductive wire is further wound in a spiral winding pattern around the second conical shaped insulating former starting at an outer edge of the second conical shaped insulating former and proceeding towards a center of the second conical shaped insulating former.

27. The method of claim 26, wherein the plurality of ferrite impedance elements each comprise a stage of ferrite element pairs.

28. The method of claim 27, wherein the ferrite impedance gradation network comprises:
a first leg comprising a first conductor cascade wound through a first ferrite element of each stage of the ferrite element pairs, the first conductor coupled to the first electrically conducting line; and
a second leg comprising a second conductor cascade wound through a second ferrite element of each stage of the ferrite element pairs, the second conductor coupled to the second electrically conducting line.

29. The method of claim 28, wherein the first conductor is wound through each respective first ferrite element of the first leg an increasing number of times starting at a first ferrite element pair electrically closest to the differential data line; and
wherein the second conductor is wound through each respective second ferrite element of the second leg an increasing number of times starting at the first ferrite element pair electrically closest to the differential data line.

30. The method of claim 26, wherein the distributed impedance interface further comprises a choke network coupled between the first ferrite impedance gradation network and the second port.

* * * * *